United States Patent
Umemoto et al.

(10) Patent No.: US 9,331,187 B2
(45) Date of Patent: May 3, 2016

(54) BIPOLAR TRANSISTOR

(71) Applicant: MURATA MANUFACTURING CO., LTD., Kyoto-fu (JP)

(72) Inventors: Yasunari Umemoto, Kyoto-fu (JP); Atsushi Kurokawa, Kyoto-fu (JP); Tsunekazu Saimei, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/821,214

(22) Filed: Aug. 7, 2015

(65) Prior Publication Data
US 2015/0349100 A1    Dec. 3, 2015

Related U.S. Application Data

(63) Continuation of application No. PCT/JP2014/053245, filed on Feb. 13, 2014.

(30) Foreign Application Priority Data
Feb. 18, 2013  (JP) .................................. 2013-028602

(51) Int. Cl.
*H01L 29/732*    (2006.01)
*H01L 31/072*    (2012.01)
(Continued)

(52) U.S. Cl.
CPC ........ *H01L 29/7325* (2013.01); *H01L 29/0821* (2013.01); *H01L 29/152* (2013.01); *H01L 29/20* (2013.01); *H01L 29/7371* (2013.01)

(58) Field of Classification Search
CPC ................ H01L 29/66318; H01L 2924/1305; H01L 29/66242; H01L 29/0817; H01L 29/41708; H01L 29/732; H01L 29/73

USPC .......... 438/312, 317, 342, 343; 257/183, 187, 257/192, 197, 200
See application file for complete search history.

(56) References Cited

U.S. PATENT DOCUMENTS

| 5,150,185 A | 9/1992 | Yamada |
| 5,557,117 A | 9/1996 | Matsuoka et al. |

(Continued)

FOREIGN PATENT DOCUMENTS

| JP | H04-127534 A | 4/1992 |
| JP | H06-326120 A | 11/1994 |

(Continued)

OTHER PUBLICATIONS

International Search Report, PCT/JP2014/053245, Apr. 8, 2014.
(Continued)

*Primary Examiner* — Hsien Ming Lee
(74) *Attorney, Agent, or Firm* — Studebaker & Brackett PC

(57) ABSTRACT

P-type second semiconductor layers each interposed between a corresponding pair of n-type first semiconductor layers reduce the apparent doping concentration in the entire collector layer without reducing the doping concentrations in the first semiconductor layers. This improves the linearity of capacitance characteristics and enables sufficient mass productivity to be achieved. Interposing each of the second semiconductor layers between the corresponding pair of the first semiconductor layers reduce the average carrier concentration over the entire collector layer, which allows a wide depletion layer to be formed inside the collector layer and, as a result, reduces base-collector capacitance.

6 Claims, 8 Drawing Sheets

(51) Int. Cl.
*H01L 21/331* (2006.01)
*H01L 29/737* (2006.01)
*H01L 29/08* (2006.01)
*H01L 29/15* (2006.01)
*H01L 29/20* (2006.01)

(56) References Cited

U.S. PATENT DOCUMENTS

| | | | |
|---|---|---|---|
| 5,684,310 A | 11/1997 | Liu | |
| 6,399,969 B1 | 6/2002 | Twynam | |
| 2010/0171151 A1* | 7/2010 | Miyajima | H01L 29/0821 257/197 |
| 2013/0285120 A1* | 10/2013 | Zampardi, Jr. | H01L 29/36 257/197 |

FOREIGN PATENT DOCUMENTS

| | | |
|---|---|---|
| JP | H07-176539 A | 7/1995 |
| JP | 2000-332023 A | 11/2000 |
| JP | 2002-076012 A | 3/2002 |
| JP | 2005-012170 A | 1/2005 |

OTHER PUBLICATIONS

Written Opinion of the International Searching Authority, PCT/JP2014/053245, Apr. 8, 2014.

Min-Chang Tu et al, "Performance of High-Reliability and High-Linearity InGaP/GaAs HBT PAs for Wireless Communication", IEEE Transactions on Electron Devices, vol. 57, No. 1, Jan. 2010.

* cited by examiner

FIG. 9

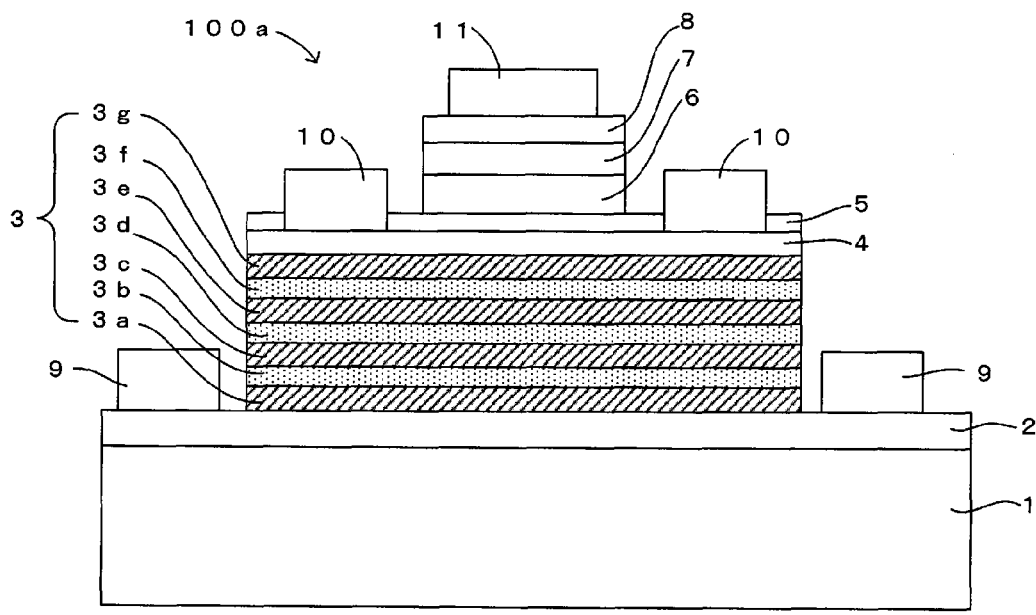

FIG. 10
PRIOR ART

| Type | Collector Structure (Thickness, doping) | | |
|---|---|---|---|
| HBT-A | 7000Å; $1 \times 10^{16}$ cm$^{-3}$ | | |
| HBT-B | 4000Å; $8 \times 10^{15}$ cm$^{-3}$ | 200Å; $5 \times 10^{17}$ cm$^{-3}$ | 2800Å; $8 \times 10^{15}$ cm$^{-3}$ |
| HBT-C | 4000Å; $8 \times 10^{15}$ cm$^{-3}$ | 300Å; $5 \times 10^{17}$ cm$^{-3}$ | 2700Å; $8 \times 10^{15}$ cm$^{-3}$ |
| HBT-D | 4500Å; $8 \times 10^{15}$ cm$^{-3}$ | 200Å; $5 \times 10^{17}$ cm$^{-3}$ | 2300Å; $8 \times 10^{15}$ cm$^{-3}$ |
| HBT-E | 4500Å; $8 \times 10^{15}$ cm$^{-3}$ | 300Å; $5 \times 10^{17}$ cm$^{-3}$ | 2200Å; $8 \times 10^{15}$ cm$^{-3}$ |
| HBT-F | 5000Å; $8 \times 10^{15}$ cm$^{-3}$ | 200Å; $5 \times 10^{17}$ cm$^{-3}$ | 1800Å; $8 \times 10^{15}$ cm$^{-3}$ |
| HBT-G | 5000Å; $8 \times 10^{15}$ cm$^{-3}$ | 300Å; $5 \times 10^{17}$ cm$^{-3}$ | 1700Å; $8 \times 10^{15}$ cm$^{-3}$ |
| HBT-H | 7000Å; $1 \times 10^{17}$ cm$^{-3}$ | | |

BIPOLAR TRANSISTOR

CROSS-REFERENCE TO RELATED APPLICATION

This application claims benefit of priority to Japanese Patent Application No. 2013-028602 filed Feb. 18, 2013, and to International Patent Application PCT/JP2014/053245 filed Feb. 13, 2014, the entire content of each of which is incorporated herein by reference.

TECHNICAL FIELD

The present disclosure relates to a bipolar transistor.

BACKGROUND

It is known that, in bipolar transistors, the linearity of the change (hereinafter, referred to as "capacitance characteristics") in base-collector capacitance Cbc with respect to collector-emitter voltage Vce (or, base-collector voltage Vbc) may affect occurrence of harmonic distortion and EVM (error vector magnitude) during a high-output operation. In the case where a bipolar transistor has capacitance characteristics such that base-collector capacitance Cbc sharply increases in the voltage range in which base-collector voltage Vbc is positive (Vbc>0 V, which substantially corresponds to Vce<1.35 V), the following problems may arise in addition to the occurrence of harmonic distortion and EVM described above. That is, when a bipolar transistor is operated with a low power supply voltage Vce (Vce<1.35 V), the gain obtained during a high-frequency operation may be significantly reduced.

In order to address the above-described problems, there has been proposed a technique in which the doping concentration in a collector layer and the distribution of the doping concentration are controlled in order to improve the linearity of the capacitance characteristics of a bipolar transistor (e.g., see IEEE Transactions on Electron Devices, (United States), IEEE, January 2010, Vol. 57, No. 1, pp. 188-194). In IEEE Transactions on Electron Devices, (United States), IEEE, January 2010, Vol. 57, No. 1, pp. 188-194, the capacitance characteristics of the following eight heterojunction bipolar transistors (HBTs) illustrated in FIG. 10 were measured (see FIG. 11): two HBTs, namely, Type A and Type H, each including a collector layer constituted by one layer having a uniform doping concentration; and six HBTs, namely, Type B to Type G, each including a collector layer constituted by three sublayers in which doping concentrations were each independently controlled. FIG. 10 illustrates the doping concentration in the collector layer of each bipolar transistor prepared in the related art and the distribution of the doping concentration. FIG. 11 illustrates the capacitance characteristics of each bipolar transistor prepared in the related art.

In Type A and Type H, the collector layer was constituted by one layer having a uniform doping concentration. In this case, in Type A in which doping concentration was set relatively low, base-collector capacitance Cbc increased about 1.67 times as collector-emitter voltage Vce decreased from 6 V to 0 V as illustrated in FIG. 11. On the other hand, base-collector capacitance Cbc increased about 2.06 times in Type H in which doping concentration was set relatively high. In addition, capacitance Cbc was larger than that measured in Type A. Thus, Type A, in which the doping concentration in the collector layer was set lower, had better capacitance characteristics than Type H in which the doping concentration in the collector layer was set higher.

In Type B to Type G, the collector layer was constituted by three sublayers in which doping concentrations were each independently controlled. The middle sublayer of the three sublayers had a higher doping concentration than the other sublayers located on the respective sides of the middle sublayer. In this case, base-collector capacitance Cbc increased about, for example, 1.25 times in Type D as collector-emitter voltage Vce decreased from 6 V to 0 V as illustrated in FIG. 11. That is, the linearity of capacitance characteristics was improved compared with Type A and Type H, in which a one-layer structure was employed.

SUMMARY

Technical Problem

As described above, the linearity of the base-collector capacitance characteristics of a bipolar transistor can be improved by setting the doping concentration in a collector layer uniformly low. However, reducing doping concentration may increase the negative impact of residual impurities that may be involuntarily mixed in the collector layer during crystal growth. Thus, in the case where the doping concentration in a collector layer is set low, in general, ease of controlling the net doping concentration may be degraded, which makes it impossible to achieve sufficient mass productivity.

In order to achieve sufficient mass productivity, it is necessary to increase the doping concentration in a collector layer to a level at which the negative impact of the residual impurities is negligible. However, in such a case, the linearity of the base-collector capacitance characteristics of a bipolar transistor may be degraded as described above. Thus, it is difficult to achieve both sufficient mass productivity and high linearity of capacitance characteristics by changing the doping concentration in a collector layer since mass productivity and the linearity of capacitance characteristics are mutually contradictory.

As described above, the linearity of base-collector capacitance characteristics can also be improved by using a collector layer constituted by three sublayers and setting the doping concentration in the middle sublayer of the three sublayers higher than those of the other sublayers located on the respective sides of the middle sublayer. However, in the case where the sublayer located at the center of the collector layer has a higher doping concentration, the linearity of capacitance characteristics is improved but, as illustrated in FIG. 11, base-collector capacitance Cbc may disadvantageously remain at a high level in the voltage range in which base-collector voltage Vbc is negative (Vbc<0 V, which substantially corresponds to Vce>1.35 V) as in Type C, Type E, and Type G illustrated in FIG. 10. Thus, it is difficult to improve the linearity of capacitance characteristics and reduce capacitance Cbc by changing the doping concentration in the middle sublayer constituting the collector layer since the linearity of capacitance characteristics and capacitance Cbc are mutually contradictory.

The present disclosure was made in light of the above-described problems. An object of the present disclosure is to provide a technique by which sufficient mass productivity may be achieved, the linearity of capacitance characteristics may be improved, and base-collector capacitance may be reduced.

Solution to Problem

In order to achieve the above-described object, a bipolar transistor according to the present disclosure includes a sub-collector layer having a first conductivity type; a collector layer stacked on the sub-collector layer; a base layer stacked on the collector layer, the base layer having a second conductivity type opposite to the first conductivity type; and an emitter layer stacked on the base layer, the emitter layer having the first conductivity type. The collector layer includes a plurality of first semiconductor layers having the first conductivity type and a plurality of second semiconductor layers having the second conductivity type. The plurality of second semiconductor layers are each interposed between a corresponding pair of the plurality of first semiconductor layers.

Another bipolar transistor according to the present disclosure includes a sub-collector layer having a first conductivity type; a collector layer stacked on the sub-collector layer; a base layer stacked on the collector layer, the base layer having a second conductivity type opposite to the first conductivity type; and an emitter layer stacked on the base layer, the emitter layer having the first conductivity type. The collector layer includes one or more first semiconductor layers having the first conductivity type and a plurality of second semiconductor layers having the second conductivity type. The plurality of second semiconductor layers are included in at least one semiconductor constituting the first semiconductor layers.

In the above-described bipolar transistors, the collector layer includes the second semiconductor layers having the second conductivity type opposite to the first conductivity type, and the second semiconductor layers are each interposed between the corresponding pair of the first semiconductor layers having the first conductivity type. In another case, the collector layer includes a plurality of the second semiconductor layers having the second conductivity type opposite to the first conductivity type, and the second semiconductor layers are included in at least one semiconductor constituting the first semiconductor layers having the first conductivity type. As a result, the doping charges in the first semiconductor layers and the doping charges in the second semiconductor layers cancel each other out, which reduces the average doping charge concentration over the entire collector layer. Consequently, the apparent doping concentration in the entire collector layer can be reduced, which improves the linearity of base-collector capacitance characteristics.

Furthermore, providing the second semiconductor layers having a conductivity type opposite to that of the first semiconductor layers reduces the apparent doping concentration in the entire collector layer without reducing the doping concentrations in the first semiconductor layers. This facilitates control of the doping concentration in the collector layer, which enables sufficient mass productivity to be achieved. Moreover, interposing each of the second semiconductor layers between the corresponding pair of the first semiconductor layers reduces the average carrier concentration over the entire collector layer. This allows a wide depletion layer to be formed inside the collector layer. The wide depletion layer formed inside the collector layer may reduce base-collector capacitance.

The second semiconductor layers may have a lower carrier concentration than the first semiconductor layers.

In such a case, the apparent doping charge of the entire collector layer is the same in polarity as the doping charge of the first semiconductor layers.

The total sum of the sheet carrier concentrations in the second semiconductor layers may be $10^9$ cm$^{-2}$ or more and less than $10^{11}$ cm$^{-2}$.

The inventors of the present disclosure have conducted various examinations repeatedly and found that setting the total sum of the sheet carrier concentrations in the second semiconductor layers to $10^9$ cm$^2$ or more and less than $10^{11}$ cm$^2$ may improve the linearity of capacitance characteristics more. In particular, setting the total sum of the sheet carrier concentrations in the second semiconductor layers to $10^{10}$ cm$^{-2}$ or more may further improve the linearity of capacitance characteristics.

The conductivity type of the entire collector layer is desirably the same in polarity as the conductivity type of the sub-collector layer and the emitter layer, that is, the first conductivity type, in order to produce a bipolar transistor.

The first and second semiconductor layers may be constituted by the same semiconductor.

In such a case, the collector layer may be easily formed since the first and second semiconductor layers are constituted by the same semiconductor.

The emitter layer and the base layer may form a heterojunction, and the emitter layer may have a larger band gap than the base layer.

In such a case, a practical heterojunction bipolar transistor can be provided.

Advantageous Effects of Disclosure

According to the present disclosure, a collector layer includes second semiconductor layers having a second conductivity type opposite to a first conductivity type of first semiconductor layers, and the second semiconductor layers are each interposed between the corresponding pair of the first semiconductor layers. This reduces the apparent doping concentration in the entire collector layer without reducing the doping concentrations in the first semiconductor layers, which enables sufficient mass productivity to be achieved and improves the linearity of base-collector capacitance characteristics. Furthermore, interposing each of the second semiconductor layers between the corresponding pair of the first semiconductor layers reduces the average carrier concentration over the entire collector layer, which allows a wide depletion layer to be formed inside the collector layer. This may reduce base-collector capacitance.

BRIEF DESCRIPTION OF THE DRAWINGS

FIG. 9 is a cross-sectional view of a bipolar transistor according to another embodiment of the present disclosure.

FIG. 10 illustrates the doping concentrations in a collector layer of a bipolar transistor of the related art and the distribution of the doping concentrations.

DETAILED DESCRIPTION

Embodiment 1

Figure 1:
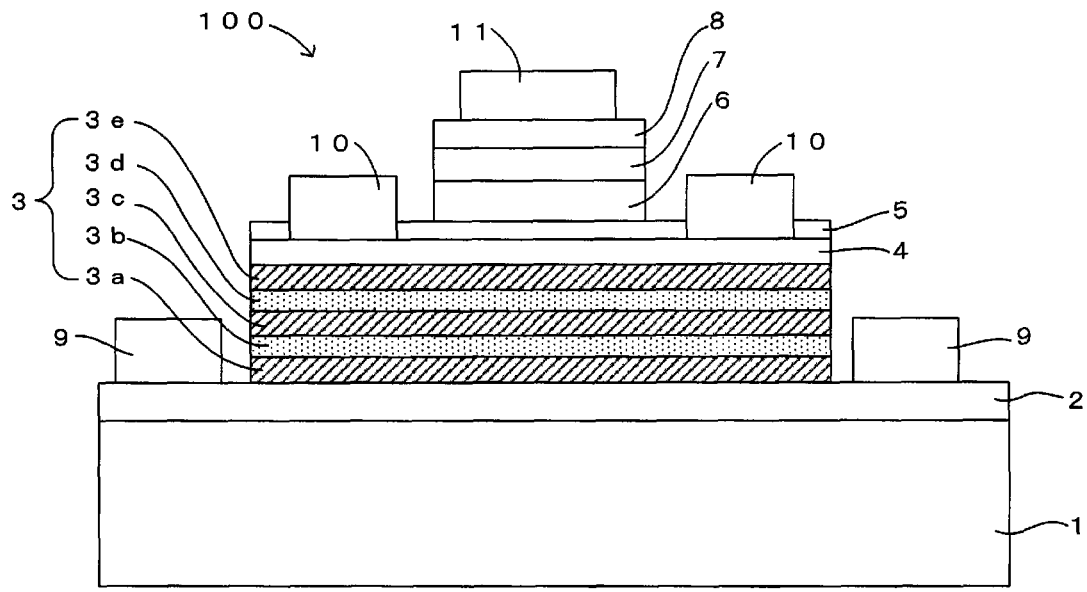
FIG. 1 is a cross-sectional view of a bipolar transistor according to an embodiment of the present disclosure.
Figure 2:
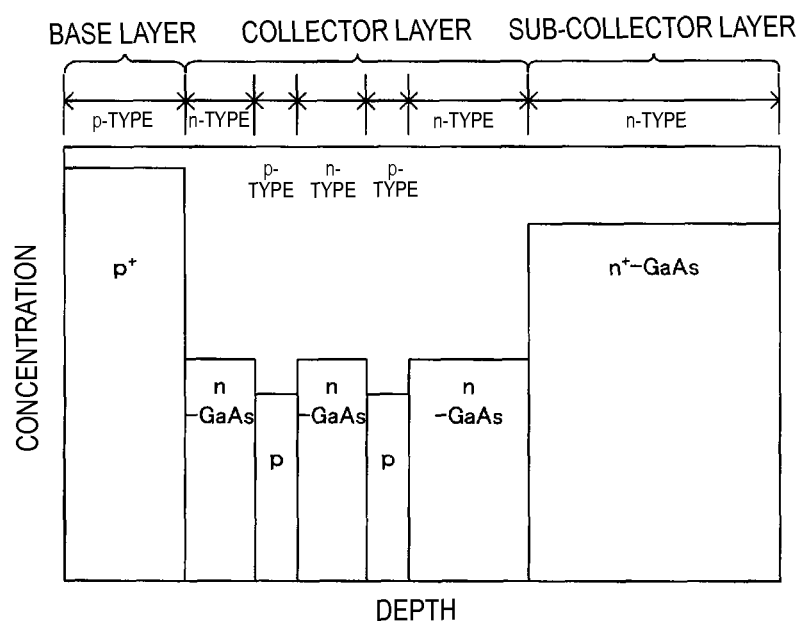
FIG. 2 illustrates concentration distribution in the bipolar transistor illustrated in FIG. 1.
Figure 3:
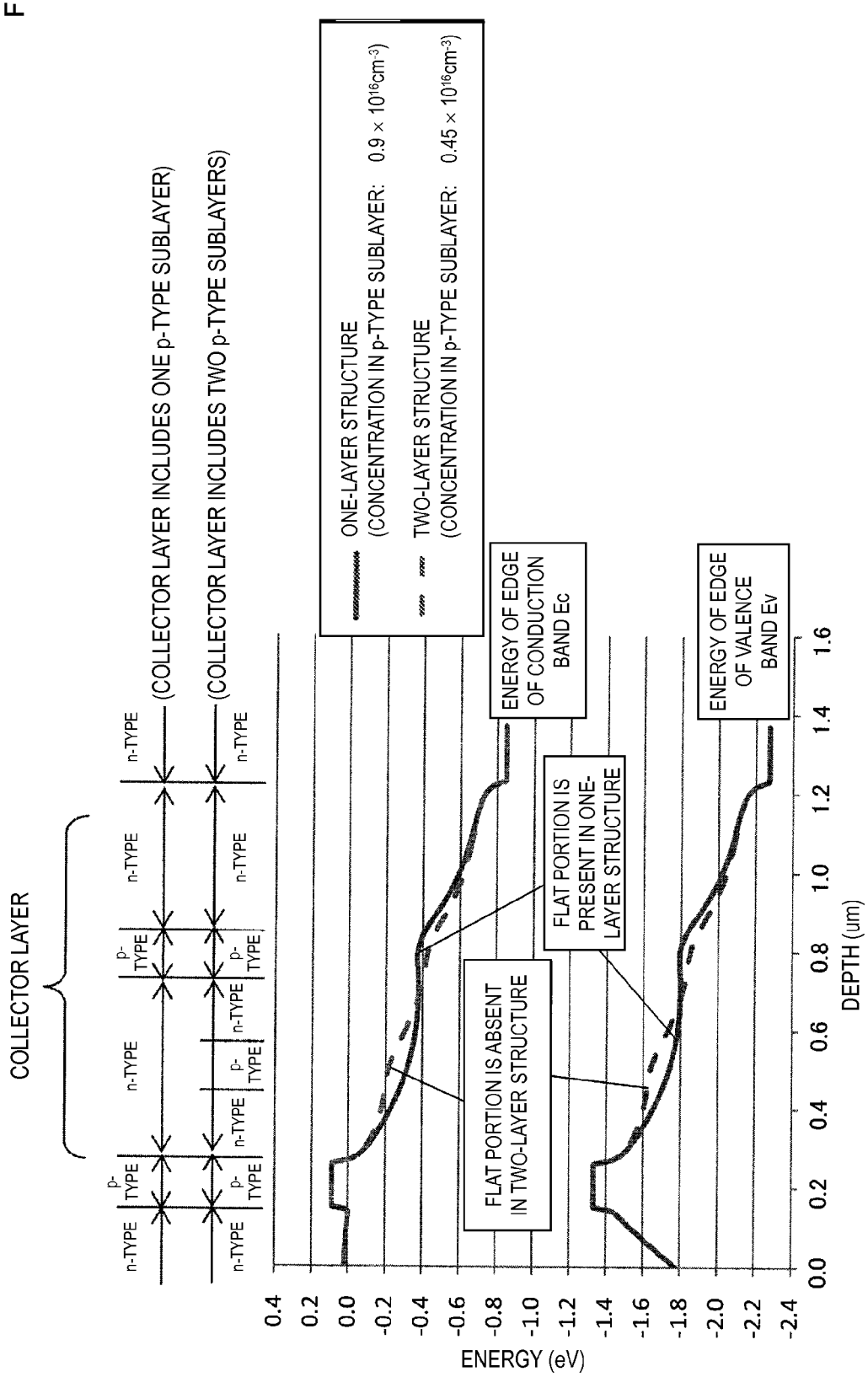
FIG. 3 illustrates the energy bands of the collector layer illustrated in FIG. 1.
Figure 4:
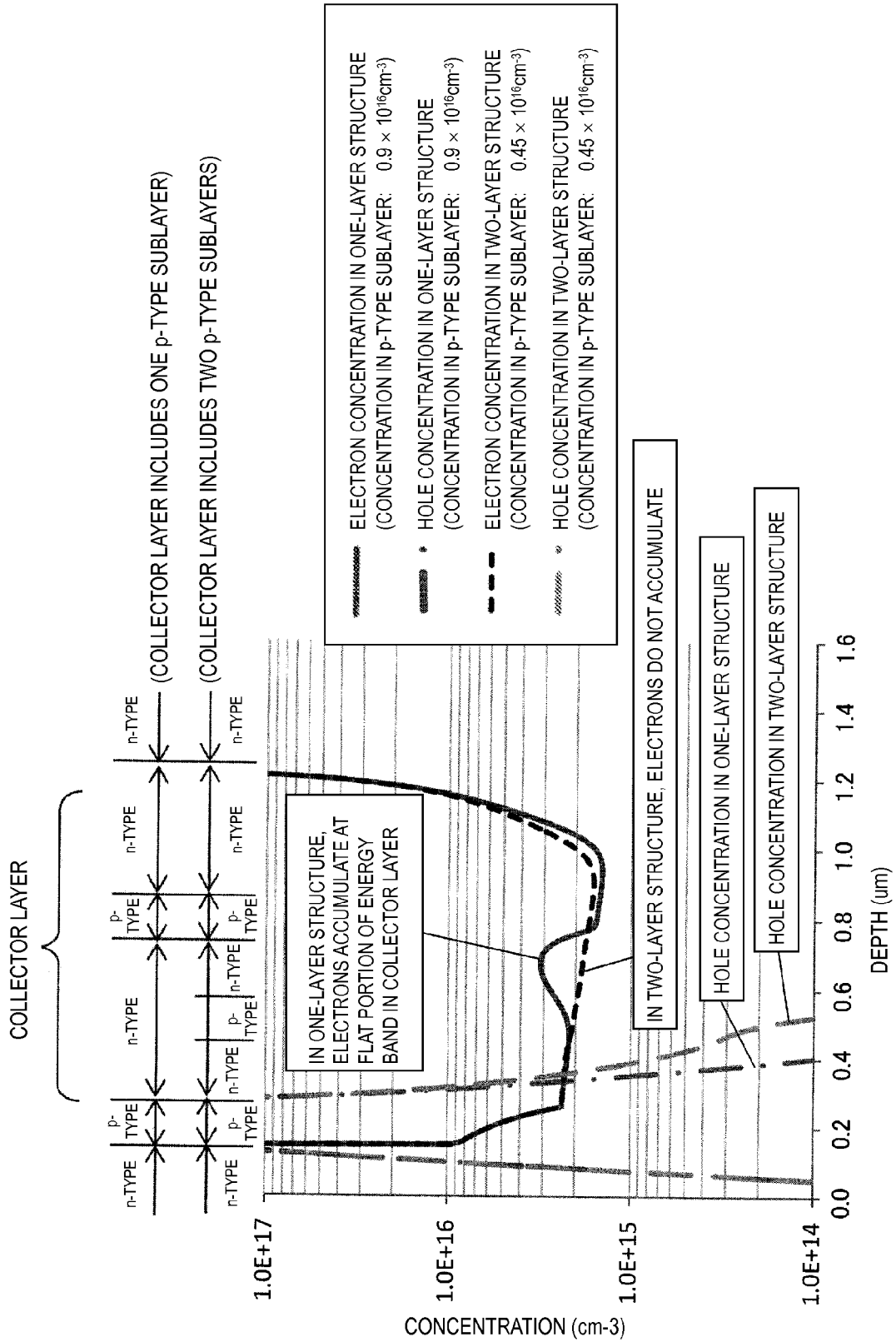
FIG. 4 illustrates the carrier concentrations in the collector layer illustrated in FIG. 1.
Figure 5:
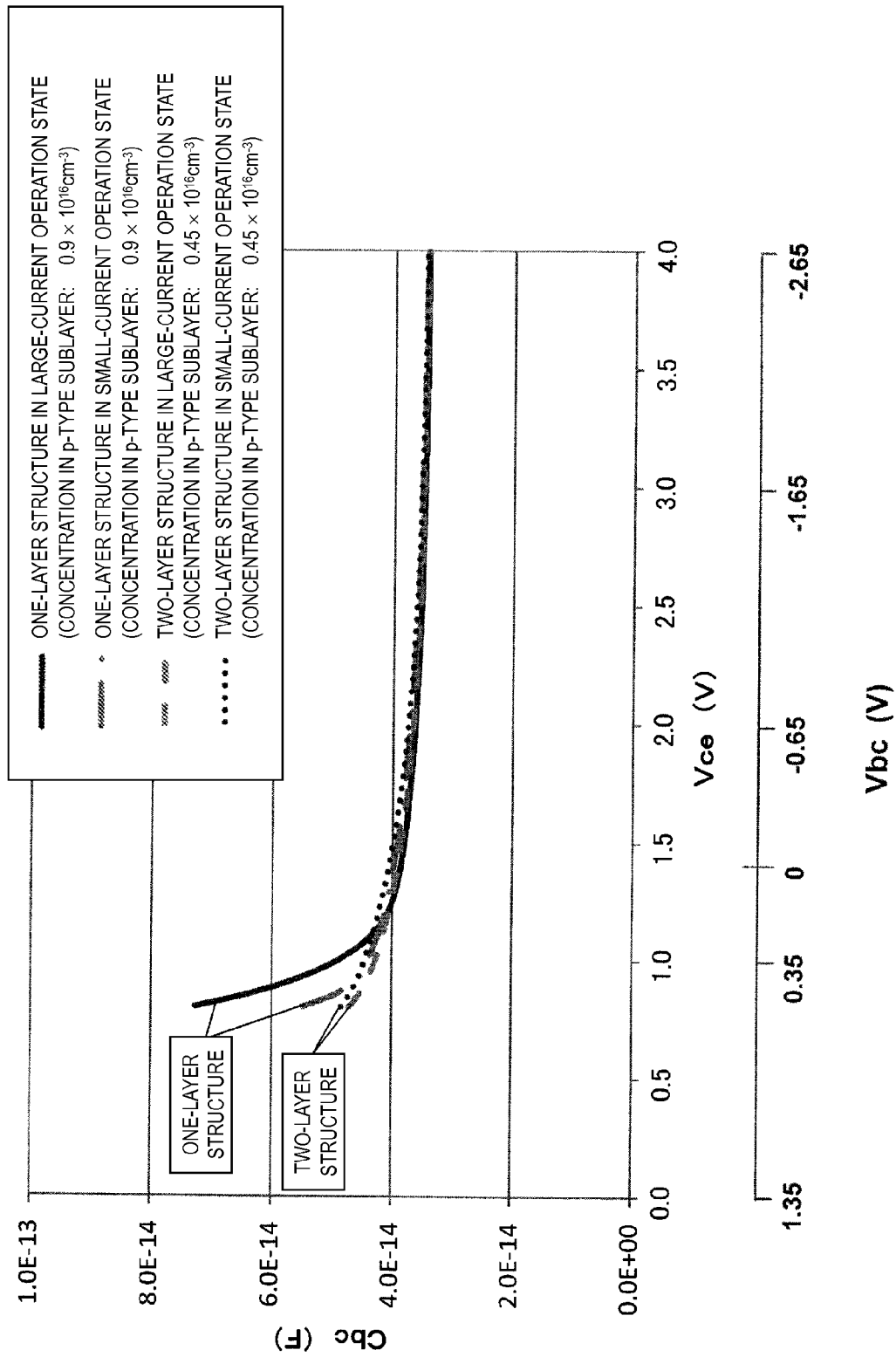
FIG. 5 illustrates the base-collector capacitance characteristics of a bipolar transistor.
Figure 6:
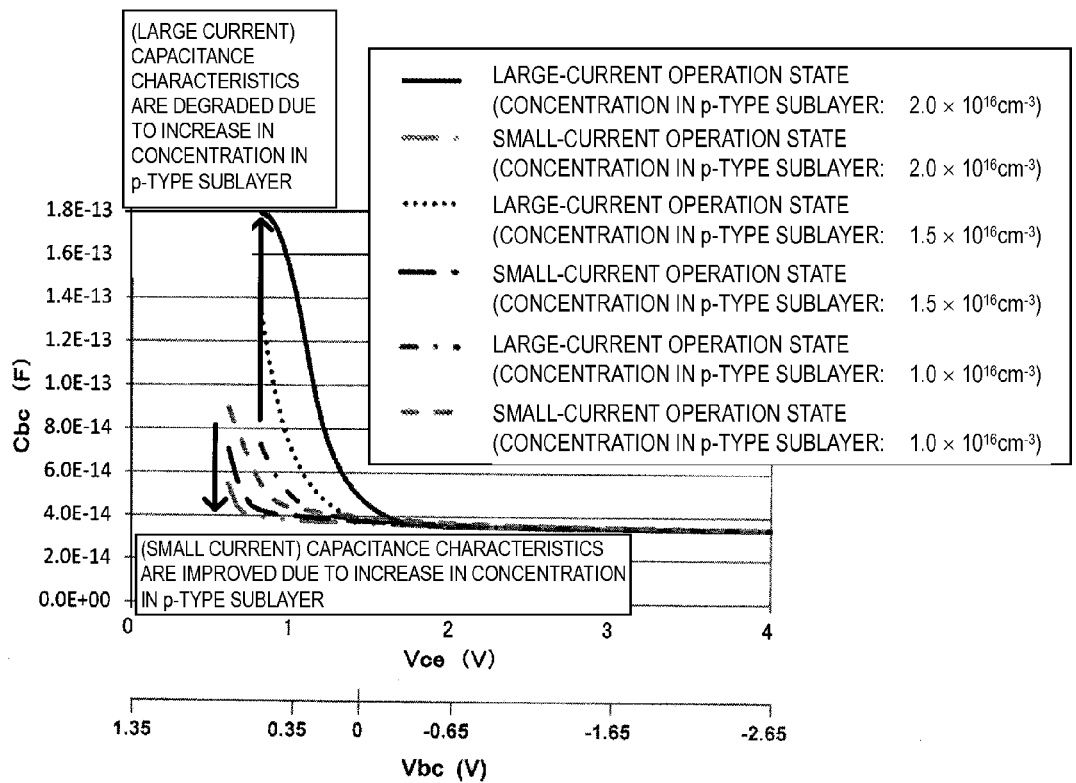
FIG. 6 illustrates the relationship between doping concentration and base-collector capacitance characteristics.
Figure 7:
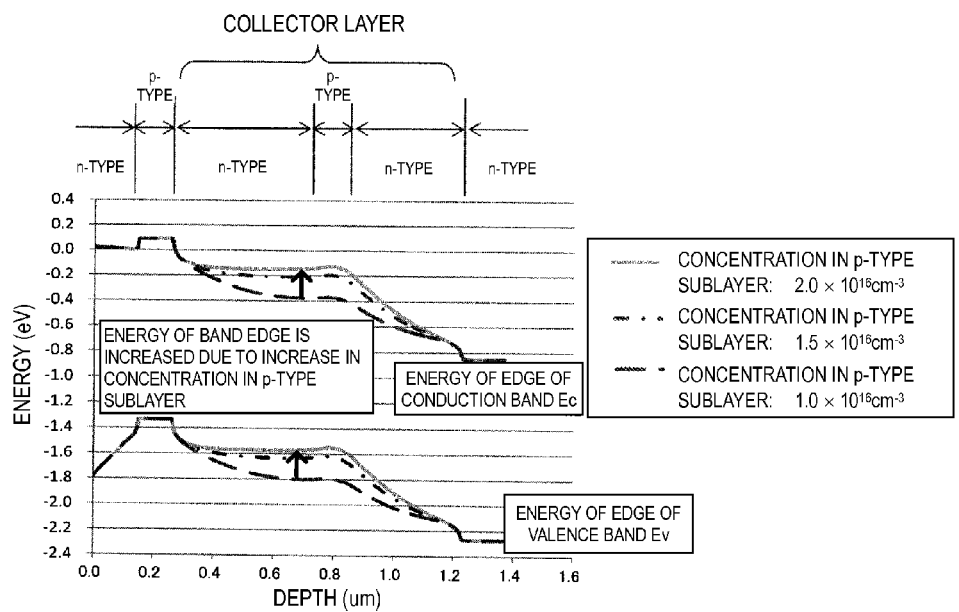
FIG. 7 illustrates the relationship between doping concentration and energy bands.
Figure 8:
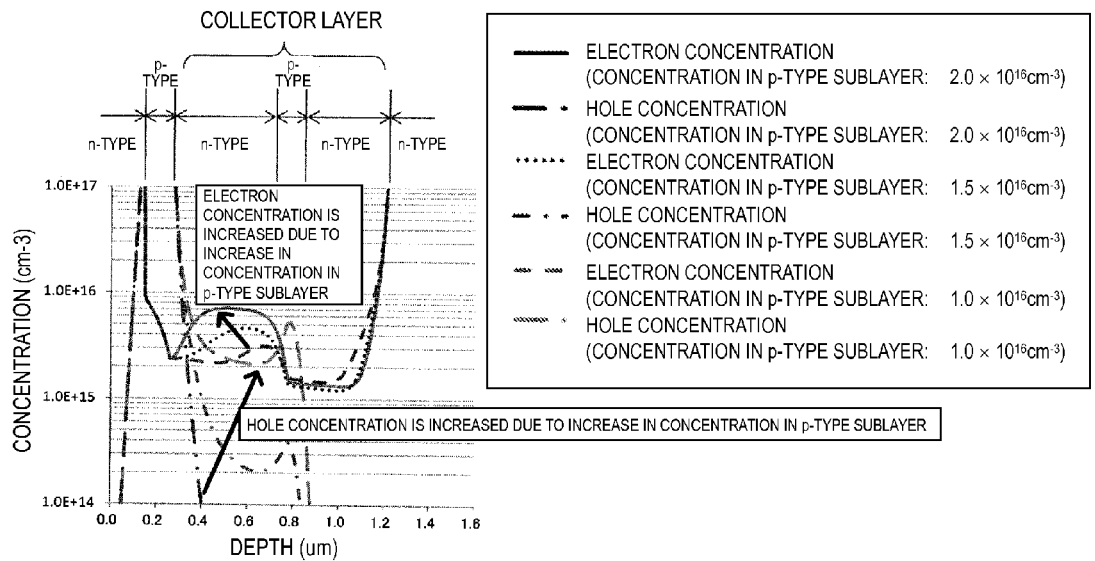
FIG. 8 illustrates the relationship between doping concentration and carrier concentrations.
Figure 11:
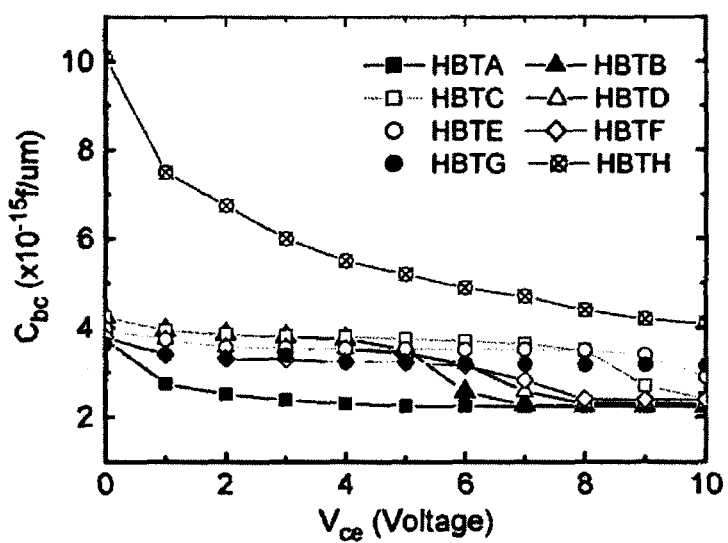
FIG. 11 illustrates the base-collector capacitance characteristics of a bipolar transistor of the related art.

One embodiment of the present disclosure is described below with reference to FIGS. 1 to 8. FIG. 1 is a cross-sectional view of a bipolar transistor according to the embodiment of the present disclosure. FIG. 2 illustrates the distribution of the net concentration of doping impurities in the bipolar transistor illustrated in FIG. 1. FIG. 3 illustrates the energy bands of the collector layer illustrated in FIG. 1. FIG. 4 illustrates the carrier concentrations in the collector layer illustrated in FIG. 1. FIG. 5 illustrates the base-collector capacitance characteristics of the bipolar transistor. FIG. 6 illustrates the relationship between doping concentration and base-collector capacitance characteristics. FIG. 7 illustrates the relationship between doping concentration and energy bands. FIG. 8 illustrates the relationship between doping concentration and carrier concentrations.

A bipolar transistor 100 includes an n-type (corresponds to "first conductivity type" herein) GaAs sub-collector layer 2 (Si concentration: $5 \times 10^{18}$ cm$^{-3}$, film thickness: 0.6 μm) stacked on a semi-insulating GaAs substrate 1; a collector layer 3 stacked on the sub-collector layer 2; a p-type (corresponds to "second conductivity type" herein) GaAs base layer 4 (C concentration: $4 \times 10^{19}$ cm$^{-3}$, film thickness: 100 nm) stacked on the collector layer 3, the base layer 4 having a conductivity type opposite to n-type; and an n-type $In_xGa_{1-x}P$ emitter layer 5 (In composition ratio: x=0.5, Si concentration: $3 \times 10^{17}$ cm$^{-3}$, film thickness: 30 nm) stacked on the base layer 4. The bipolar transistor 100 is a heterojunction bipolar transistor, in which the emitter layer 5 has a larger band gap than the base layer 4 and the base layer 4 and the emitter layer 5 form a heterojunction.

The emitter layer 5 includes an n-type GaAs layer 6 (Si concentration: $3 \times 10^{17}$ cm$^{-3}$, film thickness: 90 nm), an n-type GaAs contact layer 7 (Si concentration: $1 \times 10^{19}$ cm$^{-3}$, film thickness: 50 nm), and an n-type $In_xGa_{1-x}As$ contact layer 8 (In composition ratio: x=0.5, Si concentration: $1 \times 10^{19}$ cm$^3$, film thickness: 50 nm) that are stacked on top of one another in order.

Collector electrodes 9 are disposed on the respective end portions of the sub-collector layer 2 so as to face the corresponding side surfaces of the collector layer 3. Base electrodes 10 are disposed on the base layer 4 through the emitter layer 5. An emitter electrode 11 is disposed on the contact layer 8. The collector electrodes 9, the base electrodes 10, and the emitter electrode 11 may be formed by, for example, in the following manner.

That is, the collector electrodes 9 may be composed of a AuGe film (film thickness: 60 nm), a Ni film (film thickness: 10 nm), and a Au film (film thickness: 200 nm) that are stacked on top of one another. The base electrodes 10 may be composed of a Ti film (film thickness: 50 nm), a Pt film (film thickness: 50 nm), and an Au film (film thickness: 200 nm) that are stacked on top of one another. The emitter electrode 11 may be a WSi film (Si composition ratio: 0.3, film thickness: 0.3 μm).

The collector layer 3 includes three n-type GaAs sublayers, namely, first semiconductor layers 3a, 3c, and 3e, and two p-type GaAs sublayers, namely, second semiconductor layers 3b and 3d, that are each interposed between the corresponding pair of the first semiconductor layers 3a, 3c, and 3e. In this embodiment, the first semiconductor layers 3a, 3c, and 3e are composed of the same semiconductor. The first semiconductor layer 3a has a Si concentration of $5 \times 10^{15}$ cm$^{-3}$ and a film thickness of 350 nm. The first semiconductor layers 3c and 3e have a Si concentration of $5 \times 10^{15}$ cm$^{-3}$ and a film thickness of 200 nm. The second semiconductor layers 3b and 3d are composed of the same semiconductor and have a C concentration of $4.5 \times 10^{15}$ cm$^{-3}$ and a film thickness of 100 nm.

The total sum of the sheet carrier concentrations in the second semiconductor layers 3b and 3d may be set to $10^9$ cm$^{-2}$ or more and less than $10^{11}$ cm$^{-2}$ appropriately depending on the doping concentrations and the thicknesses of the first semiconductor layers 3a, 3c, and 3e and is desirably set to $10^{10}$ cm$^{-2}$ or more.

FIG. 2 illustrates the distribution of doping concentrations in the bipolar transistor 100 having the above-described structure. The doping concentrations in the n-type sublayers (i.e., first semiconductor layers 3a, 3c, and 3e) of the collector layer 3 are set lower than the doping concentration in the sub-collector layer 2. The doping concentrations in the p-type sublayers (i.e., second semiconductor layers 3b and 3d) of the collector layer 3 are set lower than the doping concentrations in the n-type sublayers in the collector layer 3. As described above, the sheet carrier concentrations in the second semiconductor layers may be each controlled appropriately depending on the doping concentrations and the thicknesses of the first semiconductor layers such that the carriers constituting the first conductivity type become the majority in the collector layer.

The electric charges generated inside the first semiconductor layers due to the dopant constituting the first conductivity type have properties opposite to those of the electric charges generated inside the second semiconductor layers due to the dopant constituting the second conductivity type. As a result, the bands (hereinafter, referred to as "energy bands") of energy Ec at the edge of the conduction band and energy Ev at the edge of the valence band in the first semiconductor layers are bent in a direction opposite to the curves (convex upward) of the energy bands in the second semiconductor layers (i.e., the curves of the energy bands in the first semiconductor layers are convex downward).

If the sheet carrier concentrations in the second semiconductor layers are set excessively high compared with the doping concentrations and the thicknesses of the first semiconductor layers, the electric charges generated inside the second semiconductor layers cause the energy bands to bend in a direction opposite to the curves of the energy bands which are caused by the electric charges generated inside the first semiconductor layers. As a result, a flat portion may be formed in the energy bands of the collector layer. If the flat portion is formed in the energy bands, electrons and holes may accumulate at the flat portion, which may disadvantageously increase base-collector capacitance.

Therefore, the sheet carrier concentrations in the second semiconductor layers may be each controlled appropriately depending on the doping concentrations and the thicknesses of the first semiconductor layers such that the energy bands of the collector layer are not bent upward, that is, not convex upward, due to the electric charges generated inside the second semiconductor layers but decrease substantially monotonically in the direction from the base layer to the sub-collector layer with no flat portion.

The characteristics of the bipolar transistor 100 are described with reference to FIGS. 3 to 5. In FIGS. 3 to 5, the characteristics of a bipolar transistor including a collector constituted by two n-type sublayers and one p-type sublayer interposed therebetween are illustrated as a comparative example. The doping concentration in the p-type sublayer prepared in the comparative example is set equal to the total sum of the doping concentrations in the two p-type sublayers (i.e., second semiconductor layers 3b and 3d) of the collector layer 3 included in the bipolar transistor 100 according to the embodiment. In other words, the doping concentration in the p-type sublayer of the collector layer prepared in the comparative example is set higher than the doping concentrations in the p-type sublayers (i.e., second semiconductor layers 3b and 3d) of the collector layer 3 included in the bipolar transistor 100 according to the embodiment.

Energy Bands and Carrier Concentration in Collector Layer 3

The energy bands and carrier concentration in the collector layer 3 during a large-current operation are described with reference to FIGS. 3 and 4. In FIG. 3, the horizontal axis shows depth (μm) and the vertical axis shows the energy of electrons. In FIG. 4, the horizontal axis shows the depth (μm) and the vertical axis shows carrier concentration ($cm^{-3}$).

As illustrated in FIG. 3, the energy bands of the collector layer 3 of the bipolar transistor 100 decrease monotonically in the direction from the base layer 4 to the sub-collector layer 2 with no flat portion. As illustrated in FIG. 4, significant accumulation of electrons and holes is absent over the entire collector layer 3.

In the comparative example, as illustrated in FIG. 3, a flat portion is present in a region that covers the p-type sublayer. In the comparative example, as illustrated in FIG. 4, significant accumulation of electrons is present at the flat portion of the energy bands of the collector layer and in the vicinity of the flat portion. Note that significant accumulation of holes is absent in FIG. 4 because the doping concentration in the p-type sublayer is relatively low in this case. However, in the case where the doping concentration in the p-type sublayer is set high, holes may accumulate at a higher concentration at a region of the collector layer which is substantially the same as the region at which the significant accumulation of electrons is present.

It is considered that the flat portion is formed in the energy bands of the collector layer because a dopant included in the p-type sublayer generates a negative charge inside the p-type sublayer and the negative charge causes the energy bands to bend upward in the high-energy direction. Therefore, in the case where one p-type sublayer having a high doping concentration is localized at a specific region of the collector layer as in the comparative example, the negative charge generated in the p-type sublayer causes the energy bands to bend upward in the high-energy direction in a range covering the specific region, which increases the risk of formation of the flat portion.

On the other hand, in the case where the sheet carrier concentrations in the p-type sublayers are reduced by increasing the number of the p-type sublayers to 2 or more while the total sum of the sheet carrier concentrations in the p-type sublayers is maintained constant and the p-type sublayers are arranged inside the collector layer in a distributed manner as in the collector layer 3 of the bipolar transistor 100 according to the embodiment, the following advantageous effect may occur. That is, the total amount of the negative charges included in the distributed p-type sublayers can be reduced compared with the comparative example, where the number of the p-type sublayers is one. This prevents the energy bands from being bent upward in the high-energy direction, which reduces the risk of formation of the flat portion in the energy bands. Thus, the risk of formation of the flat portion in the energy bands is reduced over the entire collector layer 3 of the bipolar transistor 100 according to the embodiment. Consequently, the risk of accumulation of carriers (i.e., electrons and holes) inside the collector layer 3 may be reduced.

It is considered that the impact of the negative charge in the p-type sublayer, which causes a flat portion to be formed in the energy bands of the collector layer, may be increased when the doping concentration in the p-type sublayer is increased and the thickness of the p-type sublayer is increased so as to increase their product, that is, sheet carrier concentration, and thereby the amount of negative charge in the p-type sublayer is increased. Therefore, the risk of formation of the flat portion in the energy bands of the collector layer, which is caused due to the p-type sublayers, may be reduced by reducing the doping concentrations in the p-type sublayers and the thicknesses of the p-type sublayers, that is, reducing the sheet carrier concentrations in the p-type sublayers, depending on the doping concentrations and the thicknesses of the n-type sublayers of the collector layer.

Capacitance Characteristics of Bipolar Transistor 100

The base-collector capacitance characteristics of the bipolar transistor 100 are described with reference to FIG. 5. In FIG. 5, the horizontal axis shows collector-emitter voltage Vce (for reference, base-collector voltage Vbc corresponding to Vbe=1.35 V is also shown) and the vertical axis shows base-collector capacitance Cbc. Hereinafter, the term "large-current" operation state refers to a state where a current of about 5 mA is passed through a transistor having an emitter area of 100 $\mu m^2$ and the term "small-current" operation state refers to a state where a current of about 0.1 mA is passed through a transistor having an emitter area of 100 $\mu m^2$.

As illustrated in FIG. 5, the linearity of the capacitance characteristics of the bipolar transistor 100 according to the embodiment is high in a small-current operation state. In addition, the bipolar transistor 100 according to the embodiment has substantially consistent capacitance characteristics both in a large-current operation state and in a small-current operation state. That is, the linearity of base-collector capacitance Cbc is maintained within a wide voltage range, that is, at a collector-emitter voltage Vce of 0.8 V to 4 V (i.e., base-collector voltage Vbc of −2.65 to 0.55 V) both in a large-current operation state and in a small-current operation state.

Specifically, base-collector capacitance Cbc increases about 1.4 times as collector-emitter voltage Vce decreases from 4 V to 0.8 V both in a large-current operation state and in a small-current operation state.

On the other hand, in the comparative example, base-collector capacitance Cbc is reduced in a positive voltage range (Vbc>0 V, which substantially corresponds to Vce<1.35 V) and the linearity of capacitance characteristics is improved in a range that covers the positive voltage region compared with the related art in a small-current operation state. However, in a large-current operation state, the linearity of capacitance characteristics is significantly degraded compared with a small-current operation state.

Specifically, in a large-current operation state, base-collector capacitance Cbc increases about 2.4 times as collector-emitter voltage Vce decreases from 4 V to 0.8 V.

As described above, the linearity of the capacitance characteristics of the bipolar transistor 100 according to the embodiment is high in a small-current operation state. This is presumably because using two p-type sublayers increases the degree of flexibility in arranging the p-type sublayers and, as a result, the p-type sublayers can be arranged at positions such that the depletion of the collector layer is performed in a more effective manner. Furthermore, there is little difference in the performance of the bipolar transistor 100 according to the embodiment between in a small-current operation state and in a large-current operation state. In particular, the linearity of capacitance characteristics in a large-current operation state is greatly improved compared with the comparative example. This is presumably due to the following reason. That is, in the bipolar transistor 100, the two second semiconductor layers 3b and 3d are arranged inside the collector layer 3 in a distributed manner. This eliminates the risk of formation of the flat portion at the edges of the conduction band and the valence band (i.e., energy bands) of the collector layer 3 and consequently the risk of accumulation of electrons and holes is reduced compared with the comparative example as illustrated in FIG. 3, which prevents an increase in capacitance from occurring.

The reason for improvement in the linearity of the capacitance characteristics of the bipolar transistor 100 according to the embodiment and the comparative example may be the following. That is, the doping charges in the first semiconductor layers and doping charges in the second semiconductor layers, which have a sign opposite to that of the doping charges of the first semiconductor layers, cancel each other out and, as a result, the average doping charge concentration over the entire collector layer is reduced. The reduction in the average doping charge concentration over the entire collector layer reduces the apparent doping concentration in the entire collector layer, which improves the linearity of capacitance characteristics. Moreover, the average carrier concentration over the entire collector layer is reduced, which allows a wide depletion layer to be formed inside the collector layer. This reduces base-collector capacitance Cbc.

The capacitance characteristics in the comparative example in a large-current operation state and a small-current operation state are described below.

As illustrated in FIG. 6, in the comparative example, increasing the doping concentration in the p-type sublayer disposed in the collector layer improves the linearity of capacitance characteristics in a small-current operation state but may deteriorate the linearity of capacitance characteristics in a large-current operation state. That is, in the comparative example, the changes in the linearity of capacitance characteristics in a small-current operation state and in a large-current operation state with the change in the doping concentration in the p-type sublayer are mutually contradictory. Thus, in the comparative example, it is difficult to improve linearity of capacitance characteristics both in a large-current operation state and in a small-current operation state.

This is presumably due to the following reason. That is, in the comparative example, the negative charge generated in the p-type sublayer, which is increased with an increase in the doping concentration in the p-type sublayer, strongly causes the energy bands of the collector layer to bend upward in the high-energy direction as illustrated in FIG. 7. As a result, the length of the flat portion of the energy bands which is formed in a region of the collector layer which covers the p-type sublayer is increased with an increase in the doping concentration in the p-type sublayer.

Consequently, the number of the carriers (electrons and holes) accumulated at the flat portion of the energy bands is gradually increased with an increase in the doping concentration in the p-type sublayer as illustrated in FIG. 8. It is considered that the increase in the number of carriers accumulated at the flat portion results in an increase in base-collector capacitance Cbc and degradation of the linearity of capacitance characteristics in a large-current operation state.

Therefore, reducing the doping concentration in the p-type sublayer to a certain level or less may reduce the risk of formation of the flat portion in the energy bands and thereby reduce the risk of accumulation of carriers. This may lead to a reduction in base-collector capacitance Cbc in a large-current operation state, which improves the linearity of capacitance characteristics. However, in such a case, the doping concentration in the p-type sublayer may become excessively low, which increases base-collector capacitance Cbc and deteriorates the linearity of capacitance characteristics in a small-current operation state (see FIG. 6). Thus, in the comparative example, it is difficult to reduce base-collector capacitance Cbc and improve the linearity of capacitance characteristics both in a large-current operation state and in a small-current operation state.

On the other hand, the bipolar transistor 100 according to the embodiment, in which a plurality of p-type sublayers (i.e., second semiconductor layers 3b and 3d) are arranged inside the collector layer 3 in a distributed manner, has the following advantageous effect. That is, the apparent doping concentration in the p-type sublayers can be increased by totaling all the dopants included in the p-type sublayers even when the doping concentrations in the p-type sublayers are set low.

As a result, in the bipolar transistor 100 according to the embodiment, in which the doping concentrations in the p-type sublayers are set low, the risk of formation of the flat portion in the energy bands of the collector layer 3 is reduced. This prevents base-collector capacitance Cbc in a large-current operation state from being excessively increased compared with a small-current operation state and improves the linearity of capacitance characteristics.

Furthermore, the apparent doping concentration in the p-type sublayers is set high. This prevents base-collector capacitance Cbc from being excessively increased over a wide voltage range that covers the positive voltage region (Vbc>0 V, which substantially corresponds to Vce<1.35 V) and improves the linearity of capacitance characteristics both in a large-current operation state and in a small-current state.

As described above, in this embodiment, the p-type second semiconductor layers 3b and 3d are interposed between the corresponding pair of the n-type first semiconductor layers 3a, 3c, and 3e. As a result, the doping charges of the first semiconductor layers 3a, 3c, and 3e and the doping charges of the second semiconductor layers 3b and 3d cancel each other out, which reduces the average doping charge concentration over the entire collector layer 3. The reduction in the average doping charge concentration over the entire collector layer 3 results in a reduction in the apparent doping concentration in the entire collector layer 3, which improves the linearity of capacitance characteristics.

Moreover, providing the second semiconductor layers 3b and 3d, which have a conductivity type opposite to that of the first semiconductor layers 3a, 3c, and 3e, enables the apparent doping concentration in the entire collector layer 3 to be reduced without reducing the doping concentrations in the first semiconductor layers 3a, 3c, and 3e. This facilitates control of the doping concentration in the collector layer 3 and enables sufficient mass productivity to be maintained. Interposing each of the second semiconductor layers 3b and 3d between the corresponding pair of the first semiconductor layers 3a, 3c, and 3e reduces the average carrier concentration over the entire collector layer 3, which allows a wide depletion layer to be formed inside the collector layer 3. The wide depletion layer formed inside the collector layer 3 may reduce base-collector capacitance Cbc. In addition, providing a plurality of the p-type sublayers increases the degree of flexibility in arranging the p-type sublayers inside the collector layer. This allows the p-type sublayers to be arranged at positions such that the depletion of the collector layer is performed in a more effective manner.

Furthermore, the first semiconductor layers 3a, 3c, and 3e and the second semiconductor layers 3b and 3d are composed of the same semiconductor GaAs, which makes it easy to form the collector layer 3.

In addition, a heterojunction bipolar transistor 100 having good capacitance characteristics, in which the emitter layer 5 and the base layer 4 form a heterojunction and the emitter layer 5 has a larger band gap than the base layer 4, may be provided.

Embodiment 2

Another embodiment of the present disclosure is described below with reference to FIG. 9. FIG. 9 is a cross-sectional view of a bipolar transistor according to the other embodiment of the present disclosure.

The bipolar transistor 100a according to the embodiment is different from the bipolar transistor 100 according to the above-described embodiment in that the collector layer 3 is constituted by seven sublayers, namely, semiconductor layers 3a to 3g. The other components of the bipolar transistor are the same as in the above-described embodiment and are designated by the same reference numerals, and the descriptions thereof are omitted.

The collector layer 3 includes four n-type GaAs sublayers, namely, first semiconductor layers 3a, 3c, 3e, and 3g, and three p-type GaAs sublayers, namely, second semiconductor layers 3b, 3d, and 3f that are each interposed between the corresponding pair of the first semiconductor layers 3a, 3c, 3e, and 3g. In this embodiment, the first semiconductor layers 3a, 3c, 3e, and 3g are composed of the same semiconductor. The first semiconductor layer 3a has a Si concentration of $5 \times 10^{15}$ cm$^{-3}$ and a film thickness of 50 nm. The first semiconductor layers 3c, 3e, and 3g have a Si concentration of $5 \times 10^{15}$ cm$^{-3}$ and a film thickness of 200 nm. The second semiconductor layers 3b, 3d, and 3f are composed of the same semiconductor and have a C concentration of $4.5 \times 10^{15}$ cm$^{-3}$ and a film thickness of 100 nm.

In this embodiment, advantageous effects similar to those in the above-described embodiment may be achieved.

The present disclosure is not limited to the above-described embodiments. Various modifications other than the above-described modifications can be made without departing from the scope of the present disclosure. For example, although an NPN-type bipolar transistor, in which the first conductivity type is n-type and the second conductivity type is p-type, is formed in the above-described embodiment, a PNP-type bipolar transistor, in which the first conductivity type is p-type and the second conductivity type is n-type, may also be formed.

Alternatively, the collector layer may include one first semiconductor layer having a first conductivity type and a plurality of second semiconductor layers having a second conductivity type opposite to the first conductivity type may be inserted into the first semiconductor layer by doping a semiconductor constituting the first semiconductor layer with impurities capable of forming the second conductivity type. In such a case, the collector layer may also include a plurality of first semiconductor layers. In the case where the collector layer includes a plurality of the first semiconductor layers, the plurality of second semiconductor layers are inserted into at least one layer of the plurality of first semiconductor layers. In another case, at least two layers of the plurality of first semiconductor layers may each include one second semiconductor layer inserted thereinto. In any case, the same advantageous effects as in the above-described embodiments may be achieved.

The number of the second semiconductor layers included in the collector layer is not limited to the above-described numbers. Four or more second semiconductor layers may be arranged inside the collector layer in a distributed manner.

Although, in the above-described embodiments, the collector layer is constituted by second semiconductor layers having the same doping concentration and the same thickness, the doping concentrations and the thicknesses of the second semiconductor layers may be each independently changed appropriately. Although, in the above-described embodiments, the first and second semiconductor layers are composed of the same semiconductor GaAs, the first and second semiconductor layers may also be formed using a plurality of semiconductors, such as GaAs, AlGaAs, and InGaP, in combination.

The combination of the emitter layer and the base layer is not limited to the InGaP/GaAs described above. The heterojunction can be formed using AlGaAs/GaAs, InP/InGaAs, InGaP/GaAsSb, InGaP/InGaAsN, Si/SiGe, or AlGaN/GaN.

INDUSTRIAL APPLICABILITY

The present disclosure can be broadly applied to various bipolar transistors but is not limited to heterojunction bipolar transistors.

The invention claimed is:

1. A bipolar transistor comprising:
a sub-collector layer having a first conductivity type;
a collector layer stacked on the sub-collector layer;
a base layer stacked on the collector layer, the base layer having a second conductivity type opposite to the first conductivity type; and
an emitter layer stacked on the base layer, the emitter layer having the first conductivity type,
wherein the collector layer includes
a plurality of first semiconductor layers having the first conductivity type, and
a plurality of second semiconductor layers having the second conductivity type, each layer of the plurality of second semiconductor layers being interposed between a corresponding pair of the plurality of first semiconductor layers.

2. The bipolar transistor according to claim 1, wherein the second semiconductor layers have a lower carrier concentration than the first semiconductor layers.

3. The bipolar transistor according to claim 1, wherein the total sum of sheet carrier concentrations in the second semiconductor layers is between $10^9$ cm$^{-2}$ and $10^{11}$ cm$^{-2}$.

4. The bipolar transistor according to claim 1, wherein the first semiconductor layers and the second semiconductor layers include the same semiconductor composition.

5. The bipolar transistor according to claim 1, wherein the emitter layer and the base layer form a heterojunction, and wherein the emitter layer has a larger band gap than the base layer.

6. A bipolar transistor comprising:
a sub-collector layer having a first conductivity type;
a collector layer stacked on the sub-collector layer;
a base layer stacked on the collector layer, the base layer having a second conductivity type opposite to the first conductivity type; and
an emitter layer stacked on the base layer, the emitter layer having the first conductivity type,
wherein the collector layer includes
one or more first semiconductor layers having the first conductivity type, and
a plurality of second semiconductor layers having the second conductivity type, the plurality of second semiconductor layers being included in at least one semiconductor constituting the one or more first semiconductor layers.

* * * * *